(12) United States Patent
Bencher et al.

(10) Patent No.: US 6,913,868 B2
(45) Date of Patent: Jul. 5, 2005

(54) CONDUCTIVE BI-LAYER E-BEAM RESIST WITH AMORPHOUS CARBON

(75) Inventors: Christopher D. Bencher, San Jose, CA (US); Ian S. Latchford, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 154 days.

(21) Appl. No.: 10/348,690

(22) Filed: Jan. 21, 2003

(65) Prior Publication Data

US 2004/0142281 A1 Jul. 22, 2004

(51) Int. Cl.[7] .................................................. G03C 5/00
(52) U.S. Cl. ....................... 430/296; 430/313; 430/314; 430/317; 430/942
(58) Field of Search ................................ 430/296, 313, 430/314, 317, 942

(56) References Cited

U.S. PATENT DOCUMENTS

| | | | |
|---|---|---|---|
| 6,368,924 B1 | 4/2002 | Mancini et al. | 438/286 |
| 6,423,384 B1 | 7/2002 | Khazeni et al. | 427/577 |
| 6,436,810 B1 | 8/2002 | Kumar et al. | 438/633 |
| 2004/0029021 A1 * | 2/2004 | Garza et al. | 430/5 |

OTHER PUBLICATIONS

Baik, et al.; *REAP(Raster E–Beam Advanced) Using 50kV Raster E–beam System for Sub–100nm Node Mask Technology*; Etec Systems, Inc.

Jamieson, et al.; *Hydrogen Silsesquioxane Bilayer Resist Process for Low–Voltage Electron beam lithography*; Paper 136 (1171–1179); Mar. 2002.

van Delft, et al.; *Hydrogen Silsesquioxane/Novolak Bilayer Resist for High Aspect Ratio Nanoscale Electron–beam Lithography*; J. Vac. Sci. Technol. B 18(6), Nov./Dec. 2000.

Helmbold, et al.; *Electrical Conductivity of Amorphous Hydrogenated Carbon*; Philosophical Magazine B, 1995, vol. 72, No. 3, 335–350.

* cited by examiner

*Primary Examiner*—Christopher G. Young
(74) *Attorney, Agent, or Firm*—Moser, Patterson & Sheridan

(57) ABSTRACT

Methods for forming a patterned layer of amorphous carbon on a substrate are described. A layer of amorphous carbon may be formed on the substrate. A layer of electron sensitive resist may be formed on top of the amorphous carbon layer. A pattern transferred into the electron sensitive resist layer with an electron beam writing process is developed. During the electron beam writing process, electrons may be conducted away from the writing area through the amorphous carbon layer. The amorphous carbon layer may be etched through in at least one region defined by the pattern developed into the layer of electron sensitive resist material. For some embodiments, the amorphous carbon layer may be formed by chemical vapor deposition. For some embodiments, the layer of electron sensitive resist may be hydrogen silsesquioxane (HSQ).

21 Claims, 6 Drawing Sheets

CONDUCTIVE BI-LAYER E-BEAM RESIST WITH AMORPHOUS CARBON

BACKGROUND OF THE INVENTION

1. Field of the Invention

Embodiments of the present invention generally relate to integrated circuit (IC) fabrication methods, and more particularly, to electron beam lithography methods for use in forming patterns in material layers of an IC.

2. Description of the Related Art

In recent years ICs have evolved into complex devices that commonly include millions of transistors, capacitors, resistors, and other electronic components on a single chip. Therefore, there is an inherent demand for increased circuit densities, as well as a continual demand for faster and more efficient circuit components. The combined demands for faster circuits having greater circuit densities imposes corresponding demands on the materials used to fabricate such integrated circuits, as well as on process sequences used for IC fabrication.

For example, in process sequences using conventional photolithographic techniques, a layer of photo-sensitive resist is generally formed over a substrate or stack of material layers on a substrate. An image of a pattern may then be introduced into the photo-sensitive resist layer. Thereafter, the pattern introduced into the photo-sensitive resist layer may be transferred into one or more layers of the material stack formed on the substrate using the layer of photo-sensitive resist as a mask. The pattern may be transferred into a material layer(s) using a chemical and/or physical etchant, which is generally designed to have a greater etch selectivity for the material layer(s) than for the photo-sensitive resist. In other words, the etchant may be designed to etch the material layer(s) at a faster rate than it etches the photo-sensitive resist. The faster etch rate for the one or more material layers of the stack typically prevents the photo-sensitive resist material from being consumed prior to completion of the pattern transfer.

Photolithographic techniques typically introduce the image of the pattern into the photo-sensitive resist layer via a mask in which the pattern is formed. A UV light source placed above the mask irradiates a surface of the layer of photo-sensitive resist with the pattern formed in the mask. Due to limitations in mask formation and associated diffraction effects, however, conventional photolithographic techniques have a lower limit in the dimension of pattern that may be formed. As feature sizes continue to shrink, alternatives to conventional photo-lithographic techniques for forming pattern dimensions below the limits of conventional photolithography are being explored. One such alternative is electron beam (e-beam) lithography.

In general, using e-beam lithography, a pattern is introduced in a layer of electron sensitive resist (e-beam resist) by exposing the resist to a focused e-beam. Rather than utilize a mask to form the patterns, the pattern is typically formed using a raster scan process, during which the e-beam is moved over a surface of the e-beam resist layer and only turned on over designated areas to form the pattern in the e-beam resist. The pattern is then transferred into the e-beam resist during a subsequent development process where either exposed or unexposed portions of the e-beam resist layer are removed depending on whether the e-beam resist is a positive resist or negative resist, respectively. Because e-beam lithography writes a pattern directly into the e-beam resist layer, without the use of a mask, smaller pattern features may be achieved.

Electrons in the e-beam are typically accelerated at voltage levels in a range of 500V to 100 kV. Conventionally, higher accelerating voltages have been associated with greater resolution, possibly due to increased stiffness of the e-beam at higher voltages. However, depending on properties of resist material, at higher accelerating voltages, forward scattering of electrons may occur as the electrons travel through the resist material, which may reduce pattern resolution. Further, backward scattering of the electrons may occur as the electrons reflect off a substrate or other material underlayer, and travel back through the e-beam resist which may also reduce pattern resolution. In an effort to reduce these scattering effects, the acceleration voltage may be lowered (e.g., in a range of 500V to 5 kV), which may also lower the penetration depth of electrons.

The low penetration depth of electrons associated with low voltage e-beam pattern imaging typically necessitates a relatively thin e-beam resist layer which, alone, may have an insufficient etch resistance for use as a mask layer in subsequent pattern transfer etching processes. Therefore, as illustrated in FIG. 1A, a bi-layer resist approach is typically taken, forming a relatively thin e-beam resist layer 106 on top of a thicker mask layer 104. Typically, the thicker mask layer 104 is formed of a non-conductive material, such as a spun-on organic resist material. However, one problem with a non-conductive mask layer 104 is a possible accumulation of electrons at or near a junction of the mask layer 104 and the e-beam resist layer 106.

As illustrated in FIG. 1B, accumulations of electrons may repel electrons from the e-beam, causing the e-beam to lose focus. As illustrated in FIG. 1C, loss of focus in the e-beam may result in a lower resolution pattern with rough sidewalls 110 transferred into the e-beam resist layer 106 during a subsequent development process (a negative resist is illustrated). Consequently, the resolution of a feature formed in the mask layer 104 (e.g., via an etching process) using the e-beam resist layer 106 as a mask may also be lowered.

Accordingly, what is needed is an improved method for forming a pattern in an IC using e-beam lithography.

SUMMARY OF THE INVENTION

Embodiments of the present invention generally provide methods for forming patterned amorphous carbon layers for use in integrated circuit (IC) fabrication.

One embodiment provides a method for forming a patterned amorphous carbon layer on a substrate. The method generally includes forming a layer of amorphous carbon on the substrate, forming a layer of hydrogen silsesquioxane (HSQ) on top of the amorphous carbon layer, developing a pattern transferred into the HSQ layer using an electron beam writing process, and etching through the amorphous carbon layer in at least one region defined by the pattern developed in the HSQ layer.

One embodiment provides a method for patterning a material layer formed on a substrate. The method generally includes depositing an amorphous carbon layer on top of the material layer, depositing a layer of hydrogen silsesquioxane (HSQ) on top of the amorphous carbon layer, developing a pattern transferred into the HSQ layer using an electron beam writing process, transferring the developed pattern into the amorphous carbon layer, and etching through the material layer in at least one region defined by the pattern transferred into the amorphous carbon layer.

One embodiment provides another method for forming a patterned layer of amorphous carbon on a substrate. The method generally includes forming a layer of amorphous carbon on the substrate, forming a layer of electron sensitive resist material on top of the layer of amorphous carbon, developing a pattern transferred into the layer of electron sensitive resist material with an e-beam writing process, and etching through the amorphous carbon layer in at least one region defined by the pattern developed into the layer of electron sensitive resist material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention generally provide methods for forming integrated circuits utilizing a bi-layer resist formed by depositing a layer of electron beam (e-beam) sensitive resist material over a layer of amorphous carbon. A pattern may be formed in the e-beam resist layer via an e-beam writing process. During the e-beam writing process, electrons passing through the e-beam resist layer may be conducted away through the amorphous carbon layer, thereby preventing the buildup of electrons which may repel electrons from the e-beam resulting in a less focused e-beam and lower resolution pattern. As used herein, the term amorphous carbon generally refers to a carbon material without long-range crystalline order, and includes diamond like carbon (DLC) materials.

Figure 1A:
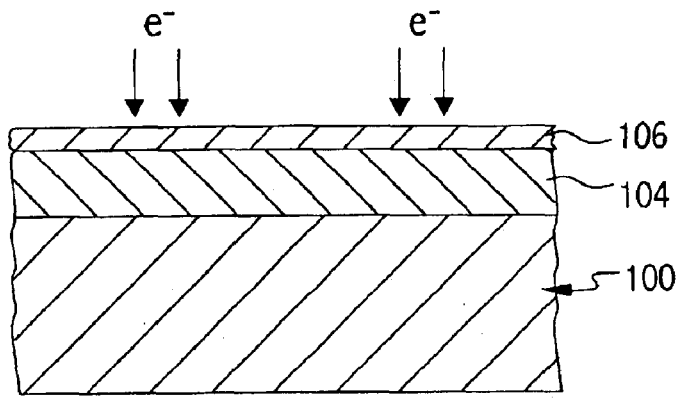
FIGS. 1A–1C illustrate cross-sectional views of a substrate structure at different stages of integrated circuit fabrication according to the prior art.
Figure 1B:
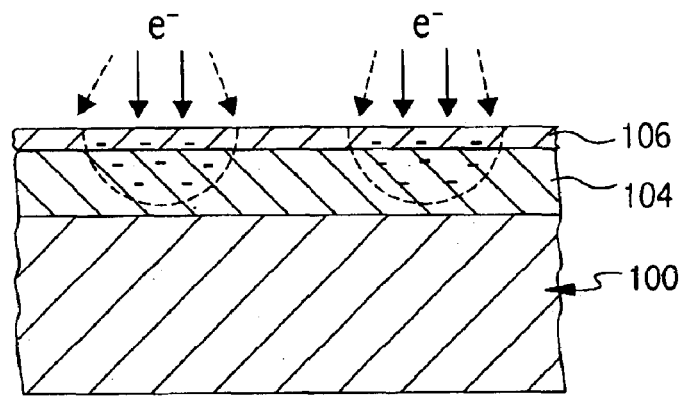
Figure 1C:
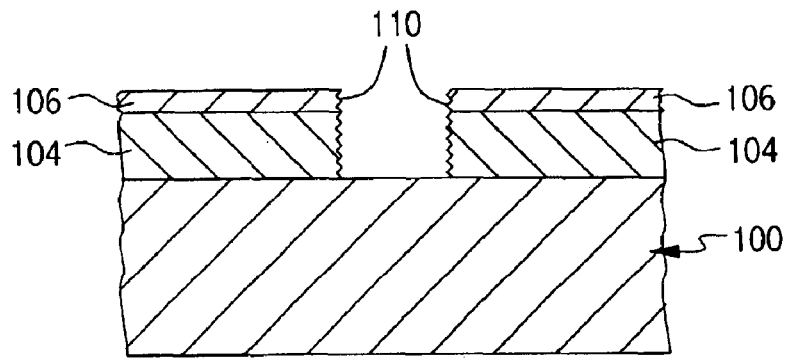
Figure 2:
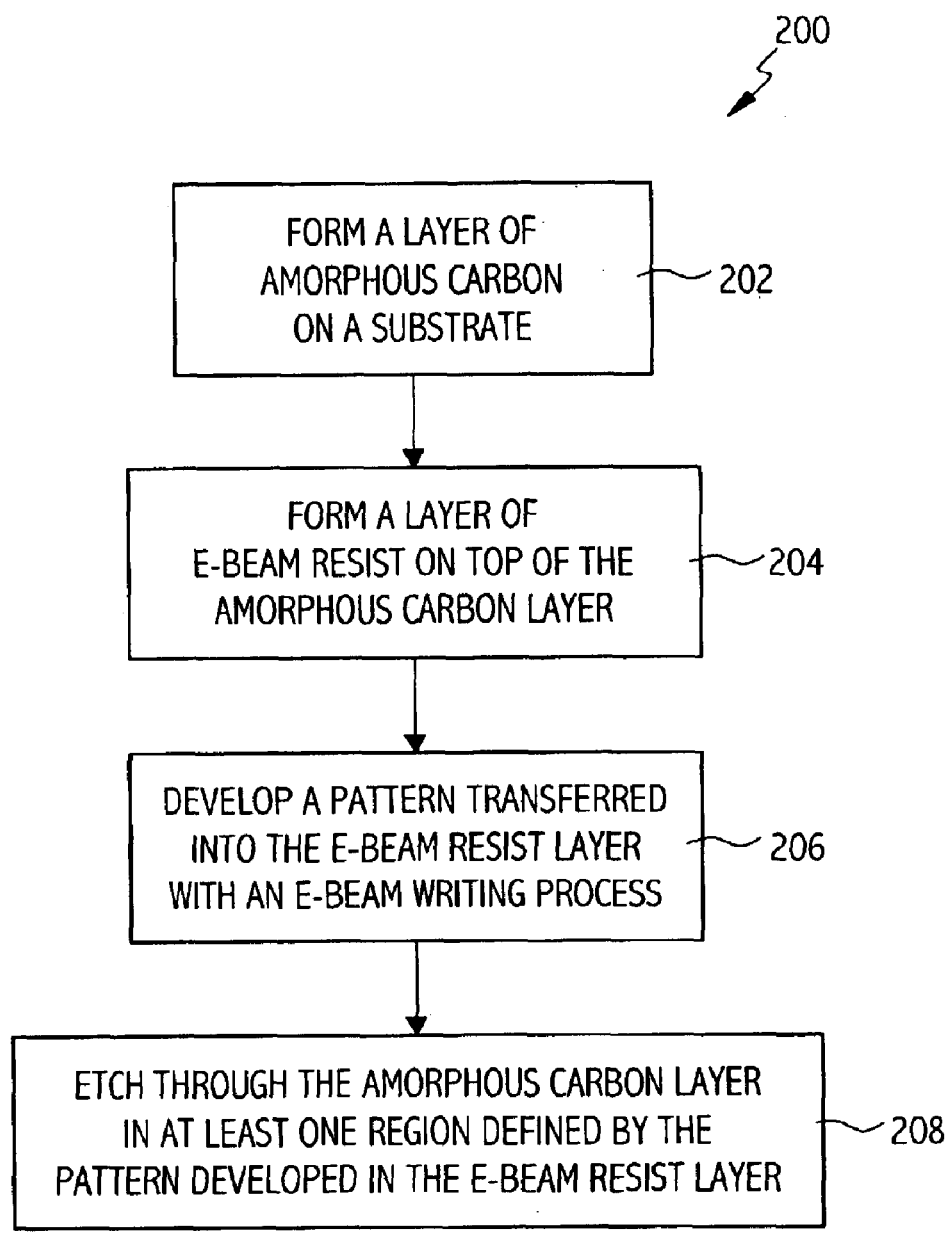
FIG. 2 illustrates exemplary operations for forming a patterned amorphous carbon layer according to an embodiment of the present invention.

FIG. 2 illustrates exemplary operations 200 for forming a patterned amorphous carbon layer according to one embodiment of the present invention. The operations 200 may be described with reference to FIGS. 3A–3F which illustrate an exemplary substrate 300 at different stages of fabricating a patterned amorphous carbon layer. In general, the substrate 300 may be any workpiece on which processing is performed, and may correspond to a silicon substrate, for example, or to a silicon substrate with one or more material layers formed thereon.

Figure 3A:
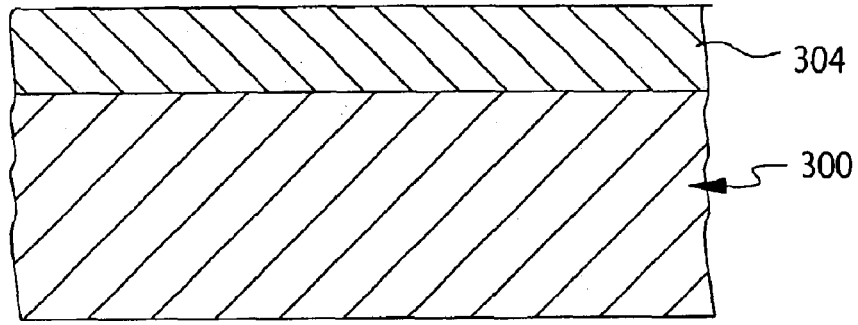
FIGS. 3A–3F illustrate cross-sectional views of a substrate structure at different stages of forming a patterned amorphous carbon layer according to an embodiment of the present invention.
Figure 3B:
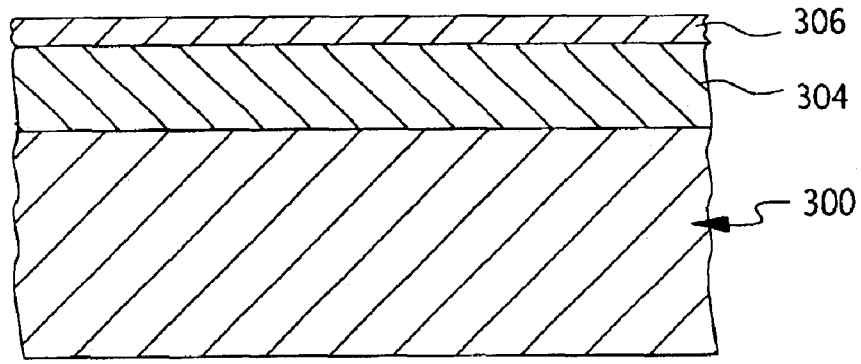

The operations 200 begin at step 202 by forming a layer of amorphous carbon on a substrate. For example, as illustrated in FIG. 3A, an amorphous carbon layer 304 may be formed on the substrate 300. A thickness of the amorphous carbon layer 304 may vary depending on the size of features to be formed in subsequent processing steps using the amorphous carbon layer 304 as a mask, but may typically be in the range of 500 Å to 2000 Å. The amorphous carbon layer 304 may be formed using any suitable process, such as ion-beam implantation, RF, microwave and plasma-enhanced chemical vapor deposition (CVD) processes. One example of a suitable method for forming the amorphous carbon layer 304 using a CVD process chamber, disclosed in the commonly assigned, co-pending U.S. patent application Ser. No. 09/921,938 filed Jun. 8, 2000, herein incorporated by reference, is described below.

The amorphous carbon layer 304 may be formed from a gas mixture of a hydrocarbon compound and an inert gas such as argon (Ar) or helium (He) in a chemical vapor deposition (CVD) process. The hydrocarbon compound may have a general formula $C_xH_y$ where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetelyne ($C_2H_2$) as well as combinations thereof, may be used as the hydrocarbon compound. Similarly, a variety of gases such as hydrogen ($H_2$), nitrogen ($N_2$), ammonia ($NH_3$), or combinations thereof, among others, may be added to the gas mixture, if desired. Ar, He, and $N_2$ may be used to control the density and deposition rate of the amorphous carbon layer 304. The, addition of $H_2$ and/or $NH_3$ can be used to control the hydrogen ratio of the amorphous carbon layer 304.

In general, the following deposition process parameters may be used to form the amorphous carbon layer 304. The process parameters range from a wafer temperature of about 100° C. to about 500° C., a chamber pressure of about 1 torr to about 20 torr, a hydrocarbon gas ($C_xH_y$) flow rate of about 50 sccm to about 500 sccm (per 8 inch wafer—for example), a RF power of between about 3 W/in$^2$ to about 20 W/in$^2$, and a plate spacing of between about 300 mils to about 600 mils. The above process parameters provide a typical deposition rate for the amorphous carbon layer 304 in the range of about 100 Å/min to about 1000 Å/min and may be implemented, for example, on a 200 mm or 300 mm substrate in a deposition chamber available from Applied Materials, Inc. of Santa Clara, Calif.

Other deposition chambers are within the scope of the invention and the parameters listed above may vary according to the particular deposition chamber used to form the amorphous carbon layer 304. For example, other deposition chambers may have a larger or smaller volume, requiring gas flow rates that are larger or smaller than those recited for deposition chambers available from Applied Materials, Inc.

The as-deposited amorphous carbon layer 304 generally has an adjustable carbon:hydrogen ratio that ranges from about 10% hydrogen to about 60% hydrogen. Controlling the hydrogen ratio of the amorphous carbon layer 304 is desirable for tuning its optical properties as well as its etch selectivity. Specifically, as the hydrogen ratio decreases the optical properties of the as-deposited layer such as for example, the index of refraction (n) and the absorption coefficient (k) increase. Similarly, as the hydrogen ratio decreases the etch resistance of the amorphous carbon layer 304 increases.

Because the amorphous carbon layer 304 may serve to conduct away electrons during an e-beam writing process, it may be desirable that the amorphous carbon layer 304 have a specific electrical conductivity. Many different parameters may determine the electrical conductivity of the amorphous carbon layer 304, such as inert and process gasses used during formation. For some embodiments, specific operations may be performed to increase electrical conductivity of the amorphous carbon layer 304, such as flowing a doping gas during a deposition process.

As an example, at room temperature (e.g., approx. 27° C.) the conductivity of pure amorphous carbon is typically in the range of $1\times10^{-7}$/W-cm to $1\times10^{-8}$/W-cm whereas the conductivity of a nitrogen doped amorphous carbon is more conductive, typically in the range of $1\times10^{-4}$/W-cm to $1\times10^{-5}$/W-cm. Temperature may also greatly affect the conductivity of amorphous carbon. For example, the conductivity of amorphous carbon may be increased by a factor of 100 or more by increasing the temperature from room temperature to 200–300° C. In a similar manner, the conductivity may degrade if the temperature is lowered below room temperature. Therefore, for some embodiments, the temperature of the amorphous carbon layer 304 may be elevated during an e-beam writing process (e.g., step 206) to increase conductivity or, at least, maintained to prevent a decrease in conductivity. For some embodiments, through doping and/or temperature control, conductivity of the amorphous carbon may be maintained at greater than $1\times10^{-6}$/W-cm during the e-beam writing process.

At step 204, an e-beam resist layer 306 is formed on top of the amorphous carbon layer 304. The e-beam resist layer 306 may be formed using any suitable technique, and may be a positive or negative resist. The thickness of the e-beam resist layer 306 may vary depending on the e-beam resist material used and acceleration voltage of the e-beam, which may both determine a penetration depth of electrons. For example, for acceleration voltages of 500 V to 5 kV, the thickness of the e-beam resist may typically range from 200 Å to 1000 Å. For some embodiments, a total thickness of the layers 304 and 306 may be in the range of 1000 Å and 2000 Å, again, depending on dimensions of features to be generated in subsequent process steps.

The material used for the e-beam resist layer 306 may vary for different applications, for example, depending on various process considerations (e.g., material cost, ease of application, equipment cost, etc.). In general, however, it may be desirable to choose the e-beam resist material such that, after e-beam exposure and subsequent development, the remaining patterned material has a low etch rate with respect to a chemical etchant used to transfer the pattern into the amorphous carbon layer 304. For example, the remaining patterned material may have an etch rate in the chemical etchant that is at least 10 times less than an etch rate of the amorphous carbon layer in the chemical etchant. Examples of chemical etchants that may be used to transfer the pattern into the amorphous carbon layer include oxygen, ozone, and ammonium plasmas.

One example of a suitable e-beam resist material is hydrogen silsesquioxane (HSQ), which is typically used as an inter-layer dielectric (ILD) material in multilevel metal IC designs. HSQ is formed of cross-linked SiO2, with Si—H bonds on the corners. HSQ is sold under the trade name FOx (standing for flowable oxide), by Dow-Corning, and is available in varying concentrations of HSQ dissolved in methyl isobutyl ketone (MIBK). A layer of HSQ may be formed on top of the amorphous carbon layer via a spin-coating process. A subsequent baking process (e.g., 120° C. on a hot plate at 5 min.) may be performed to cure the HSQ prior to e-beam exposure, to form a porous amorphous film. The HSQ layer having a thickness in the range of 200 Å to 1000 Å may be deposited on a layer of amorphous carbon having a thickness in the range of 500 Å to 2000 Å. For some embodiments, a combined thickness of the HSQ layer and amorphous carbon layer may be less than 2000 Å.

Figure 3C:
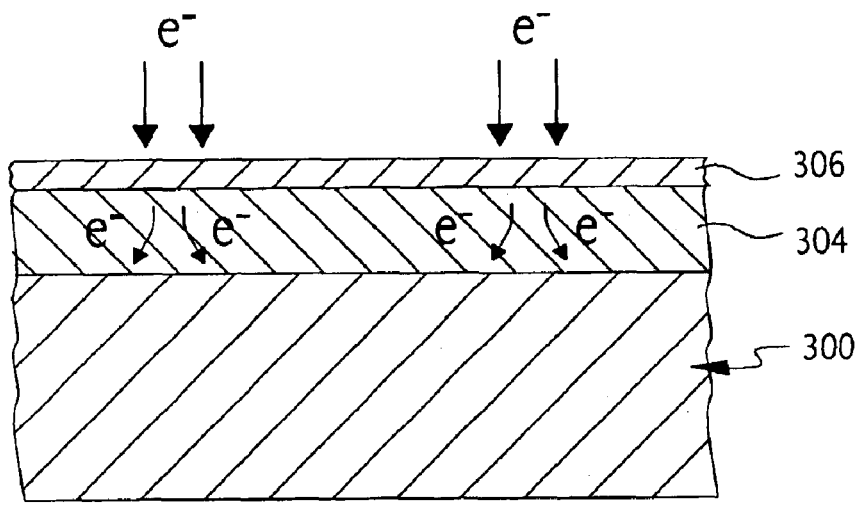

At step 206, a pattern transferred into the e-beam resist layer with an e-beam writing process is developed. As previously described, the e-beam writing may be performed at a relatively low accelerating voltage, for example, in the range of 500 V to 5 kV. A corresponding radiation dosage may be in the range of 20 and 200 uC/cm$^2$. As illustrated in FIG. 3C, during the e-beam writing process, electrons may be conducted away from the e-beam through the amorphous carbon layer 304. Thus, the amorphous carbon layer may prevent a build up of electrons and associated accumulation of charge which may repel electrons and bring the e-beam out of focus.

It is anticipated that for different embodiments, one or more intermediate layers may be formed between the amorphous carbon layer 304 and the e-beam resist layer 306. For example, intermediate layers may be used to facilitate forming the e-beam resist layer (e.g., the intermediate layer may enhance adhesion of the e-beam resist layer). In such a case, such intermediate levels may be designed with sufficient conductivity to allow conduction of electrons away from the e-beam writing process or, alternatively, thin enough not to prevent electrons from the e-beam from penetrating the amorphous carbon layer 304.

Figure 3D:
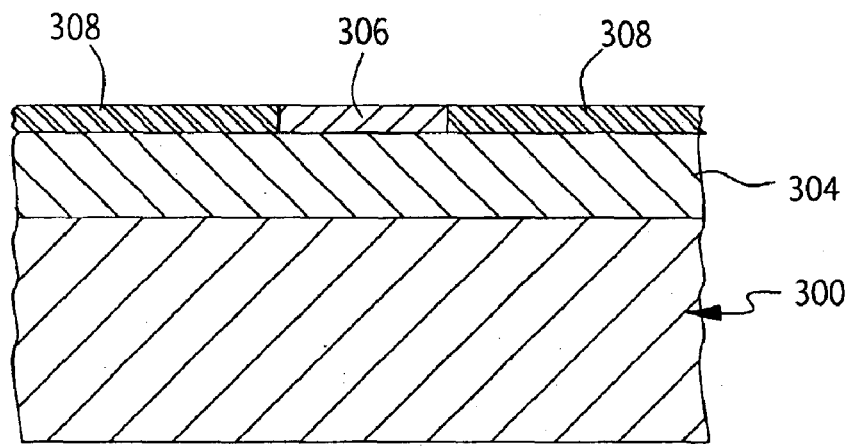
Figure 3E:
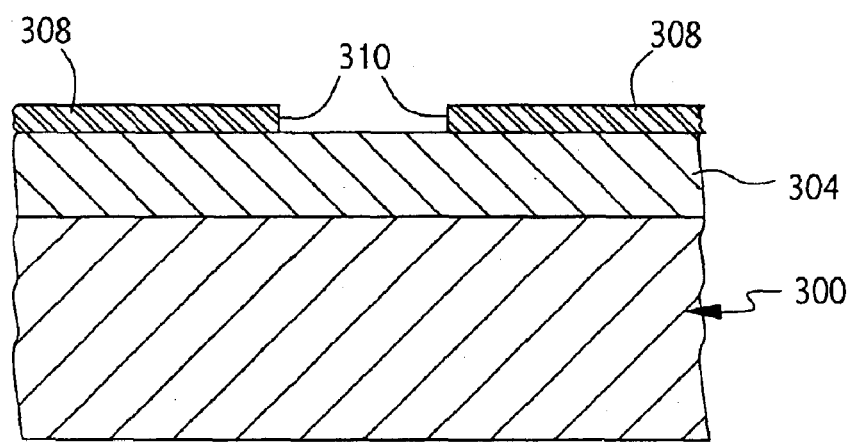
Figure 3F:
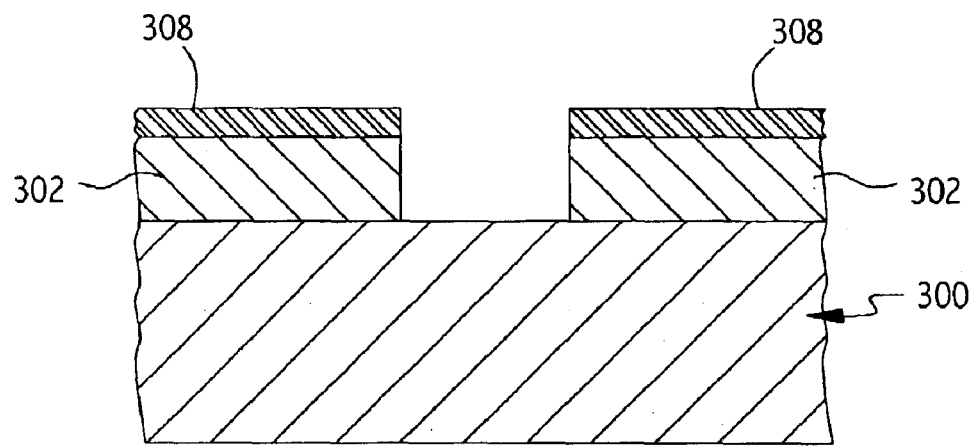

FIGS. 3D and 3E illustrate the substrate 300 before and after a development process, respectively. As illustrated by different cross-hatching, exposed portions 308 of the e-beam resist material layer 306 may be altered by the e-beam writing process. For negative resist materials (such as HSQ), this alteration may make the exposed portions 308 resistant to a development process. Accordingly, only the exposed portions 308 of the e-beam resist layer 306 may remain after development. Of course, if the e-beam resist layer 306 were a positive resist, exposed portions of the e-beam resist would be removed during the development process and only the unexposed portions would remain. Regardless, sidewalls 310 of the resulting pattern may be smooth, in part, due to maintaining focus of the e-beam by conducting electrons through the amorphous carbon layer 304. Conductivity of the amorphous carbon layer 304 may also improve overall resolution of the e-beam writing. For example, with the conductive amorphous carbon layer 304 deposited on the substrate, the e-beam may be focused to a smaller pin-point on the surface. As previously described, without a conductive layer, electrons may accumulate and the e-beam may spread near the substrate surface due to charge repelling forces.

At step 208, the amorphous carbon layer is etched through in at least one region defined by the pattern in the e-beam resist layer. For example, the amorphous carbon layer 304 may be etched via an oxygen plasma etching process, using the (remaining portions 308) of the e-beam resist layer 306 as a mask. Any suitable oxygen plasma etching process may be used to transfer the pattern into the amorphous carbon layer 304. As an example, for one embodiment, the pattern may be transferred into the amorphous carbon layer 304 by an etching process performed in an etch chamber using the following parameters: 9–27 sccm $O_2$, 20–60 sccm HBr, 20–60 sccm Ar, 2–6 mTorr, 500–1500 Watts Source, and 75–225 Watts Bias at a temperature of 50° C.

As previously described, the material used for the e-beam resist layer 306 may be chosen such that the remaining patterned material may have a low etch rate with respect the etchant used to transfer the pattern into the amorphous carbon layer. HSQ, for example, has a very low etch rate in $O_2$ plasma, possibly due to its silicon oxide content. Accordingly, if the amorphous carbon layer is etched using an $O_2$ plasma, the majority of an HSQ e-beam resist layer may remain after transferring the pattern into the amorphous carbon layer. The HSQ e-beam resist layer may be removed during a separate etching process. Alternatively, the HSQ e-beam resist layer may be removed during subsequent processing steps.

Using the e-beam writing process and amorphous carbon layer 304 described above, dimensions of features (e.g., lines and spaces) of the pattern formed in the amorphous carbon layer may be reduced beyond the limits of conventional photolithography techniques. For example, pattern dimensions less than 100 nm (e.g., 30, 40, and 50 nm) may be achieved with high resolution.

For example, during subsequent processing steps, the patterned amorphous carbon layer 304 (and remaining e-beam resist layer) may be used as a mask to transfer the pattern into the substrate 300. In addition to being conductive, the amorphous carbon layer 304 will typically also have high etch selectivities to other materials used in semi-conductors such as SiO2 (>20:1), Silicon (>6:1), Aluminum (>9:1), and Nitride (>5:1). In other words, the amorphous carbon layer 304 may be used to an advantage, not only to improve e-beam writing process, but also as a mask layer for etching most semiconductor materials. Furthermore, because it is carbon based, following the successful etch of the substrate it can be easily removed in an oxygen plasma without harming most semi-conductor materials. Accordingly, for some embodiments, a patterned amorphous carbon layer 304 may be formed on top of one or more material layers formed on the substrate 300.

For example, in one exemplary fabrication sequence, a pattern defined in an amorphous carbon layer may be incorporated into a structure of an integrated circuit, such as a damascene structure. Damascene structures are typically used to form metal interconnects on integrated circuits. FIGS. 4A–4D illustrate schematic cross-sectional views of a substrate 400 having a dielectric layer 402 formed thereon, at different stages of a damascene structure fabrication sequence. The dielectric layer 402 may be any suitable dielectric material, such as an oxide (e.g., silicon dioxide, fluorosilicate glass, etc.). For different embodiments, the dielectric layer 402 may also represent one or more additional material layers.

Figure 4A:
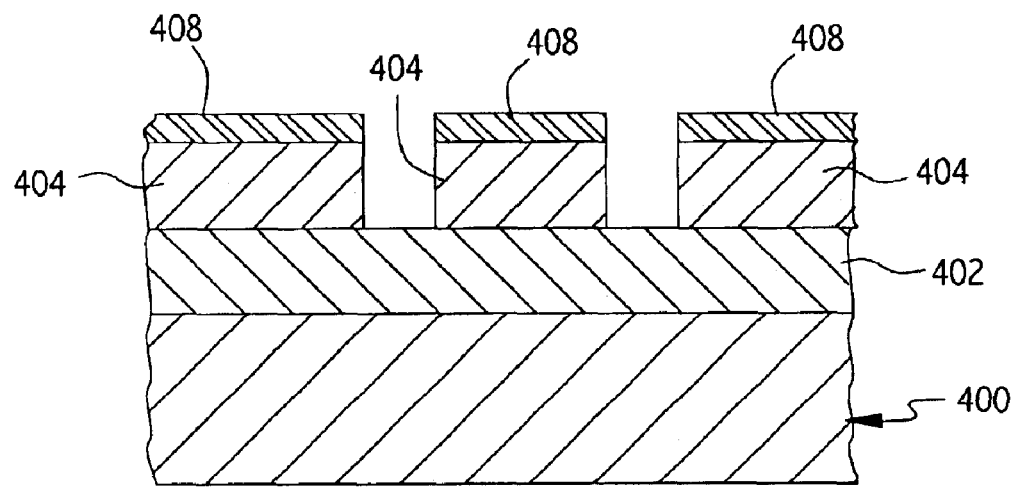
FIGS. 4A–4D illustrate cross-sectional views of a substrate structure at different stages of integrated circuit fabrication according to another embodiment of the present invention.
Figure 4B:
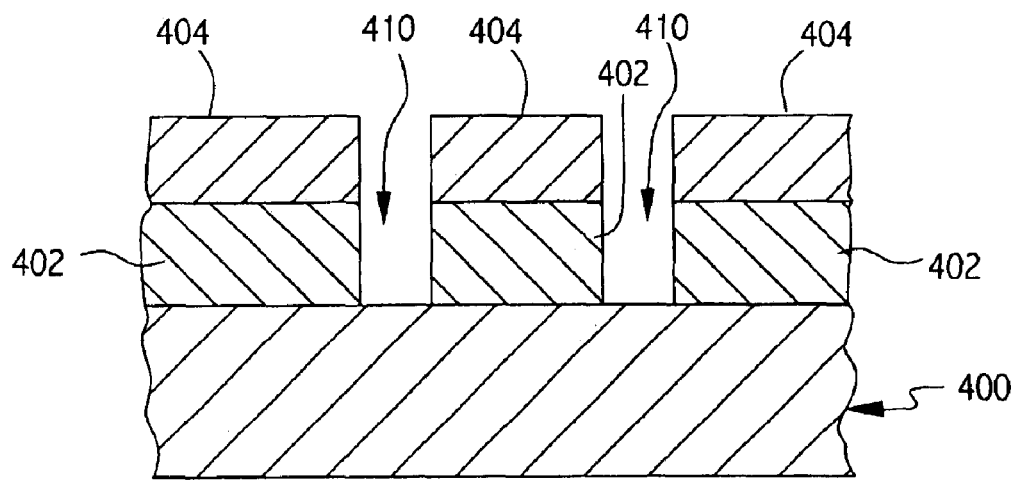

As illustrated in FIG. 4A, a patterned amorphous carbon layer 404 may be formed on the dielectric layer 402 using the process described above. The dielectric layer 402 may have a thickness of about 5,000 Å to about 10,000 Å depending on the size of the structure to be fabricated. The amorphous carbon layer 404 may have a thickness of about 200 Å to about 1000 Å. As illustrated in FIG. 4B, the pattern formed in the amorphous carbon layer 404 may be transferred into the dielectric layer 402 to form contact/via openings 410 using the amorphous carbon layer 404 as a mask. The contacts/vias openings 410 may be formed, for example, using reactive ion etching (RIE) or other anisotropic etching techniques. As illustrated, an e-beam resist layer 408 may also be removed when forming the contact/vias openings 410. For example, HSQ may be removed during an RIE etching process, thus eliminating the need for an additional process step for removal.

Typically, when the dielectric layer 402 is an oxide layer, and the substrate 400 is a silicon substrate, the amorphous carbon layer 404 of the present invention has an etch selectivity to the oxide of greater than about 10:1. In other words, the oxide will typically etch more than 10 times faster than the amorphous carbon layer 404. Thus, in addition to the advantages to using the amorphous carbon during e-beam writing, the amorphous carbon layer 404 may also provide excellent etch selectivity for patterning an oxide dielectric layer 402. In contrast, using other material mask layers, additional intermediate hardmask layers may also be required to get the desired etch selectivity.

Figure 4C:
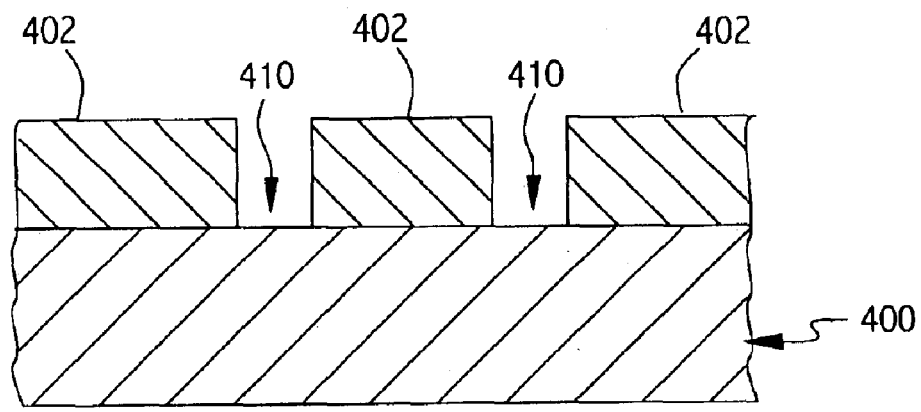
Figure 4D:
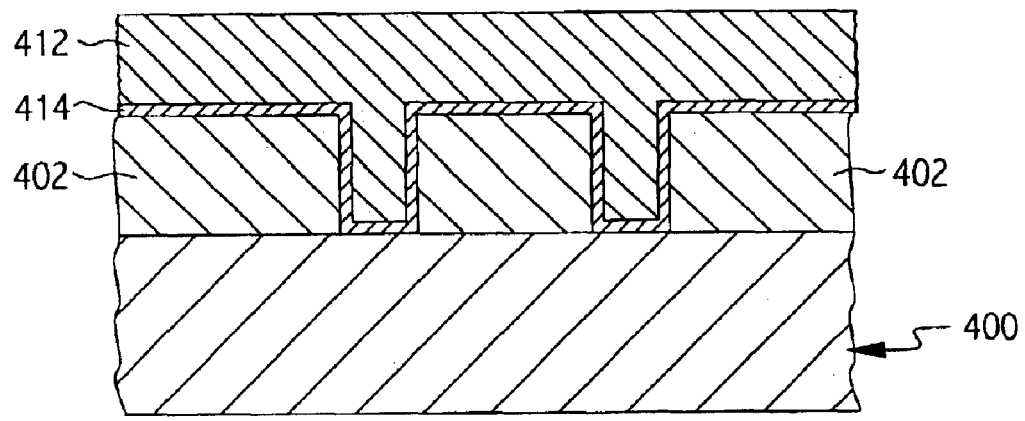

After the contacts/vias openings 410 are transferred into the dielectric layer 402, the amorphous carbon layer may be stripped from dielectric layer 402 by etching, for example, as illustrated in FIG. 4C. As illustrated in FIG. 4D, a metallization structure may be formed in the contacts/vias openings 410 using a conductive material layer 412 such as aluminum, copper, tungsten, or combinations thereof. Typically, copper or an alloy thereof is used to form the conductive material layer 412 due to its low resistivity (about 1.7 $\mu\Omega$-cm). The conductive material layer 412 may be deposited using chemical vapor deposition, physical vapor deposition, electroplating, or combinations thereof, to form the damascene structure. As illustrated, a barrier layer 414 such as tantalum, tantalum nitride, or other suitable barrier may first be deposited conformally in the metallization structure in order to prevent metal migration into the surrounding dielectric layer 402. Additionally, the dielectric layer 402 may have a low dielectric constant (e.g., less than about 4.5) in order to prevent capacitive coupling between adjacent contacts/vias openings 410 of the metallization structure.

While the foregoing is directed to embodiments of the present invention, other and further embodiments of the invention may be devised without departing from the basic scope thereof, and the scope thereof is determined by the claims that follow.

What is claimed is:

1. A method for forming a patterned amorphous carbon layer on a substrate, comprising:
   forming an amorphous carbon layer on the substrate;
   forming a layer of hydrogen silsesquioxane (HSQ) on top of the amorphous carbon layer;
   developing a pattern transferred into the HSQ layer using an electron beam writing process; and
   etching through the amorphous carbon layer in at least one region defined by the pattern developed in the HSQ layer.

2. The method of claim 1, wherein the electron beam writing process comprises an electron beam writing process using an accelerating voltage of less than 5 kV.

3. The method of claim 2, wherein the accelerating voltage is between 500 V and 3 kV.

4. The method of claim 1, wherein a combined thickness of the amorphous carbon layer and the HSQ layer is less than 2000 Å.

5. The method of claim 4, wherein a thickness of the HSQ layer is between 200 Å and 500 Å.

6. The method of claim 1, wherein at least one dimension of the pattern is less than 100 nm.

7. The method of claim 1, wherein forming the amorphous carbon layer on the substrate comprises:
   positioning the substrate in a deposition chamber;
   providing a gas mixture to the deposition chamber, wherein the gas mixture comprises one or more hydrocarbon compounds and an inert gas; and
   heating the gas mixture to thermally decompose the one or more hydrocarbon compounds in the gas mixture to form an amorphous carbon layer on the substrate.

8. The method of claim 7, wherein the gas mixture further comprises one or more doping gases to increase an electrical conductivity of the amorphous carbon layer.

9. The method of claim 1, wherein the amorphous carbon layer has a carbon:hydrogen ratio in the range of about 10% hydrogen to about 60% hydrogen.

10. The method of claim 1, further comprising forming one or more intermediate layers on top of the amorphous carbon layer prior to forming the HSQ layer.

11. The method of claim 1, wherein an electrical conductivity of the amorphous carbon is greater than $1 \times 10^{-6}/1$W-cm during the electron beam writing process.

12. A method for patterning a material layer formed on a substrate, comprising:
   depositing an amorphous carbon layer on top of the material layer;
   depositing a layer of hydrogen silsesquioxane (HSQ) on top of the amorphous carbon layer;
   developing a pattern transferred into the HSQ layer using an electron beam writing process;
   transferring the developed pattern into the amorphous carbon layer; and
   etching through the material layer in at least one region defined by the pattern transferred into the amorphous carbon layer.

13. The method of claim 12, wherein at least one dimension of the pattern is less than 100 nm.

14. The method of claim 12, wherein the layer of HSQ is also etched through while etching through the material layer.

15. The method of claim 14, wherein etching through the material layer comprises reactive ion etching.

16. The method of claim 12, wherein the material layer comprises a dielectric material and the method further comprises:
   removing the amorphous carbon layer via an etching process; and
   subsequently forming one or more metal layers over the material layer.

17. A method for forming a patterned layer of amorphous carbon on a substrate, comprising:
   forming a layer of amorphous carbon on the substrate;
   forming a layer of electron sensitive resist material on top of the layer of amorphous carbon;
   developing a pattern transferred into the layer of electron sensitive resist material with an e-beam writing process; and
   etching through the amorphous carbon layer in at least one region defined by the pattern developed into the layer of electron sensitive resist material.

18. The method of claim 17, wherein etching through the amorphous carbon layer comprises a plasma etching process using an oxygen, ammonium, or ozone plasma.

19. The method of claim 18, wherein, subsequent to development, the remaining electron sensitive resist material has an etch rate in the plasma etching process at least 10 times less than an etch rate of the amorphous carbon layer.

20. The method of claim 17, wherein forming the amorphous carbon layer on the substrate comprises:
   positioning the substrate in a deposition chamber;
   providing a gas mixture to the deposition chamber, wherein the gas mixture comprises one or more hydrocarbon compounds and an inert gas; and
   heating the gas mixture to thermally decompose the one or more hydrocarbon compounds in the gas mixture to form an amorphous carbon layer on the substrate.

21. The method of claim 20, wherein the gas mixture further comprises one or more doping gases to increase an electrical conductivity of the amorphous carbon layer.

* * * * *

UNITED STATES PATENT AND TRADEMARK OFFICE
CERTIFICATE OF CORRECTION

PATENT NO. : 6,913,868 B2  Page 1 of 1
APPLICATION NO. : 10/348690
DATED : July 5, 2005
INVENTOR(S) : Christopher D. Bencher and Ian S. Latchford It is certified that error appears in the above-identified patent and that said Letters Patent is hereby corrected as shown below:

<u>In the Specificiation</u>

Column 5, Lines 6, 8, 9, and 22: Change all five instances of "/W-cm" to --$\Omega^{-1}cm^{-1}$--

<u>In the Claims</u>

Column 9, Claim 11, Lines 8-9: Change "/1W-cm" to --$\Omega^{-1}cm^{-1}$--

Signed and Sealed this

Ninth Day of January, 2007

JON W. DUDAS
*Director of the United States Patent and Trademark Office*